United States Patent [19]

Forsberg

[11] 4,074,207

[45] Feb. 14, 1978

[54] INTERFERENCE RESISTANT PHASE-LOCKED LOOP

[75] Inventor: Gunnar Stefan Forsberg, Stockholm, Sweden

[73] Assignee: Telefonaktiebolaget L M Ericsson, Stockholm, Sweden

[21] Appl. No.: 749,875

[22] Filed: Dec. 13, 1976

[30] Foreign Application Priority Data

Dec. 30, 1975 Sweden .................................. 7514797

[51] Int. Cl.$^2$ ............................................. H03B 3/04
[52] U.S. Cl. ..................................... 331/1 A; 331/17; 331/25
[58] Field of Search ...................... 331/1 A, 17, 18, 25

[56] References Cited

U.S. PATENT DOCUMENTS

| 3,573,649 | 4/1971 | West .................................. 331/17 X |
| 3,903,482 | 9/1975 | Pausini et al. .......................... 331/17 |

*Primary Examiner*—Siegfried H. Grimm
*Attorney, Agent, or Firm*—Hane, Roberts, Spiecens & Cohen

[57] ABSTRACT

A phase-locked loop, especially for carrier frequency generation in frequency division multiplex telecommunication systems, which is insensitive to large instantaneous phase differences appearing at the input of the phase discriminator has in its forward path the series combination of a differentiating circuit, a limiter and an integrating circuit.

5 Claims, 5 Drawing Figures

INTERFERENCE RESISTANT PHASE-LOCKED LOOP

The present invention relates to an interference resistant phase-locked loop system.

A field of application for such phase-locked loops is, for example, the generation of carrier frequencies in FDM (Frequency Division Multiplex) telecommunication systems. In such systems a number of stabilized carrier frequency signals with different frequencies are generated from the output signal of a highly stable crystal controlled oscillator.

The phase-locked loop consists of a feed-back control system. As input signal to the system a frequency stable signal is provided from a generator. This stabilized signal is fed to one of the inputs of a phase discriminator. The discriminator constitutes the difference signal generator of the control system and receives as second input signal the feed-back signal of the system. The output voltage from the phase discriminator is a D.C. voltage whose magnitude is a function of the phase difference between the two input signals. The D.C. voltage is filtered and fed to the control input of a voltage controlled oscillator, the output signal of which possibly after frequency division is fed back to the second input of the phase discriminator according to the above. The output signal of the voltage controlled oscillator also constitutes the output signal of the system. Phase-locked loops of this type are disclosed in, for example, The Bell System Technical Journal, March 1962.

One drawback of phase-locked loops of this elementary type is, among other things, that disturbances in the input signal of the control system appearing as sudden phase jumps cause in certain applications unallowably large and lengthy frequency deviations from nominal frequency of the output signal from the voltage controlled oscillator.

Phase-locked loops are previously known in which efforts have been made to reduce the influence of the phase-jumps at the inputs to the phase discriminator by reducing the transient time after such an interference. This is made possible by using sampled signal processing in the phase-locked loop.

An object of the invention is to provide a phase-locked loop which at its output, i.e. the output of the voltage controlled oscillator, generates a signal with less frequency deviation than what is possible with arrangements according to known techniques, when interferences appearing as, for example, phase jumps are at the inputs of the phase discriminator.

The characteristics of the invention appear from the appended claims.

The invention will be described more in detail below with reference to the accompanying drawings where:

Figure 1:
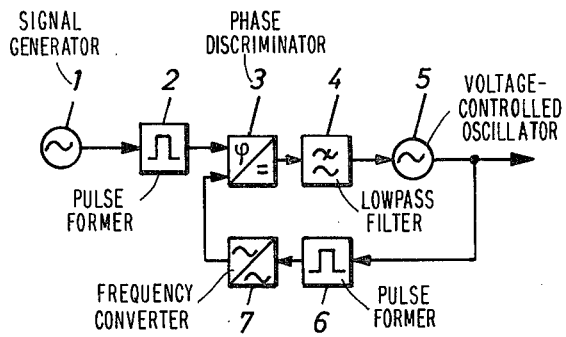
FIG. 1 shows a phase-locked loop of elementary type.

FIG. 1 shows an elementary phase-locked loop according to known techniques. A very frequency stable generator 1 is via a pulse former 2 connected to one input of a phase discriminator 3. In the following is assumed that the discriminator is of the so called saw tooth type which means that the output signal is a D.C. voltage with a magnitude constituting an approximately linear function of the phase difference between the input signals. The output of the discriminator is connected to a low-pass filter 4 for the filtering of high frequency interferences from the not-ideal phase discriminator and noise in the input signals. The filtered D.C. voltage then is caused to actuate a voltage controlled oscillator 5, which on its output generates a sinusoidal signal with a nominal frequency which is a multiple or submultiple of the frequency of the generator 1. The output signal of the generator 5 is fed back via a pulse former 6 and frequency converter 7 to the second input of the phase discriminator 3. The frequency converter has such a division or multiplication ratio that the signals to both inputs of the phase discriminator in the steady state have the same frequency.

In carrier frequency generation systems utilizing phase-locked loops the problem arises with the sensitivity of the loop to instantaneous changes in the phase difference at the inputs of the discriminator. For reliability reasons the crystal controlled main oscillators according to FIG. 1 are often doubled and switching between these oscillators must be realizable when the system is in operation. As the oscillators are not phase locked to each other a phase jump occurs at one input of the discriminator, when switching, corresponding to half a period in the worst case. If such a phase jump is allowed to influence the generated carrier frequencies serious errors can arise in the transmission of the communication system. During digital data transmission it is possible to loose frame synchronization.

From the above description of the apparatus according to FIG. 1 it is apparent that an interference of said kind would evidently substantially influence the output signal of the loop.

Figure 2:
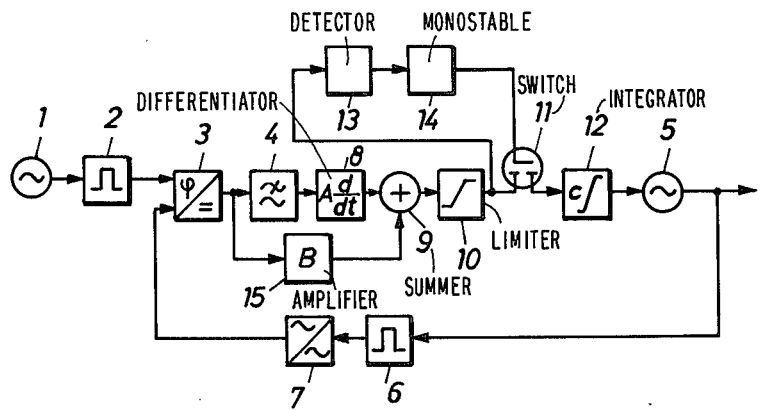
FIG. 2 shows an apparatus according to the invention.

In FIG. 2 there is shown an embodiment of the phase-locked loop according to the invention. The principal difference compared with the loop according to FIG. 1 is that after the low-pass filter 4 a differentiating circuit 8, a limiter 10 and an integrating circuit 12 are connected in series. Equivalent units in FIGS. 1 and 2 have received the same designations. The differentiating circuit at the output of the filter 4 can also include amplification which fact has been symbolized with the amplification factor A in the figure. Between the output and the input of the following limiter 10 of the differentiating circuit, a summing circuit 9 has been inserted for adding the output signal from the differentiating circuit and a signal contribution from the output of the discriminator 3. The special function of this circuit will be described more in detail below. The limiter 10 limits the output signal from the summing circuit to two levels symmetrically arranged on both sides of a zero level. Between the limiter and the following integrating circuit an electrically controlled contact or switch 11 is connected which for example can consist of a C-MOS circuit. A more detailed description of the function of this contact and its cooperating units 13 and 14 will follow below. The integrating circuit can also have an amplifying or attenuating function which has been symbolized by means of the factor C in the Figure. The output from the integrating circuit supplies control voltage to the generator 5.

A change in the output signal from the discriminator 3 appears as a pulse at the output of the differentiating circuit 8. If we for a moment disregard the signal contribution which is passed from the output of the discriminator via the amplifier 15 to the summing circuit 9, a phase change at the input of the discriminator 3 connected to the generator 1 will produce a pulse at the input of the limiter 10. Provided that the phase modulation at the input of the discriminator is small the limiting in the circuit 10 will not be in operation and the difference compared with the function of the loop according to FIG. 1 will only be an amplification by a factor AC. If on the other hand a more significant phase modulation at the input of the discriminator for example in the form of a phase jump is provided the signal magnitude at the output of the differentiating circuit 8 will exceed the limiting level. The output signal from the following integrating circuit 12 will thereby be a ramp, the derivative of which is limited by the position of the limiting levels relative to the zero level. As in the same way as in the apparatus according to FIG. 1, the deviation from the nominal frequency at the output of the generator 5 is proportional to the deviation from the steady-state voltage value at the control input and frequency deviation of the output signal will be very small in the apparatus according to the invention.

The output signal of the generator 5 is fed back via the pulse former 6 and the frequency converter 7 to the second input of the phase discriminator. The phase difference change at the inputs of the discriminator arising from a frequency difference between the output signals of the generator 1 and the converter 7 will in the same way as in the apparatus according to FIG. 1 tend to drive the signal to the nominal frequency from the generator 5.

Owing to the influence of the limiting it is possible on the whole to disregard the influence of the feedback during the analysis of the operation of the loop. This means in its turn that the pulse length at the output from the differentiating circuit 8 is rather independent of the exact position of the limiting levels provided that the limiting is significant.

If we for a moment disregard the effect of the feed forward connection from the output of the discriminator via the amplifier 15 to the summing circuit 9 an error signal will be introduced in the system owing to the fact that the differentiating and integrating circuits are suitably realized by means of active operational amplifiers. This error signal has its origin in the OFF-SET voltages of the amplifiers. These OFF-SET voltages effect the loop so that in the steady state the input signals to the discriminator does not have exactly the same frequency i.e. the output frequency of the generator 5 is not a multiple or submultiple of the signal frequency from the generator 1. This phenomenon may be explained in the following way.

First all the OFF-SET voltages are thought of as being reduced to the input of the limiter where their sum then appears as a constant error voltage. If it is further assumed that the system is in the steady state, then the frequency at the output of the generator 5 is constant. On this assumption the control voltage to the generator 5 is also constant which in its turn means that the input voltage to the integrating circuit 12 as well as to the limiter is zero. At the input of the latter circuit there was, however, according to what is previously mentioned a reduced constant OFF-SET voltage which means that the output signal from the differentiating circuit 8 must, compared to this, have the same magnitude and opposite sign for the mentioned assumption to be fulfilled. This means that the input signal to the differentiating circuit as well as to the low pass filter has to be a positive or negative ramp which in its turn means that the input signals to the discriminator have the mentioned constant frequency difference.

In order to eliminate this frequency difference there now has been inserted a feed forward path from the output of the discriminator to an input of the summing circuit 9. One could also as an alternative use a feed forward path from the output of the filter 4. Owing to the effect of the OFF-SET voltages there was according to the above a ramp at the output of the phase discriminator 3. This means that the output signal from the amplifier 15 also will be a ramp. It is here understood that the amplification B of the unit 15 may be less than one. The ramp at the output of the amplifier 15 will rise and fall respectively until the OFF-SET voltages are exactly balanced at the input of the limiter 10. At that point the output frequency from the generator 5 assumes nominal value and the loop is phase-locked.

When the above described part of the apparatus according to FIG. 2 there is thus achieved an important improvement concerning the insensibility of the phase-locked loop to phase jumps at the input to the discriminator 3 from the generator 1. The instantaneous frequency deviations at the output of the generator 5 do in fact approach zero when the limiting levels approach zero. A limiting level equal to zero is of course theoretical because regard has to be taken to among other things the phase jitter on the inputs to the discriminator. This means that one has to take into account a certain smallest practical value of the limiting in the circuit 10.

For phase jumps which cause a certain smallest amplitude of the pulse after the differentiating circuit, an amplitude which for example equals the limiting amplitude, the frequency deviations can further be reduced at the output of the generator 5 by an increase of the time constant for the integrating circuit 12. This can for example be achieved by an interruption at the input of the integrating circuit which theoretically is equivalent to making the time constant infinitely large. The same effect can be achieved by short-circuiting the input of the integrating circuit to the reference voltage.

In order to initiate such break or short-circuiting at a suitable instant the occurrence of the limiting is detected. In FIG. 2 the output of the limiter is connected to a detecting circuit 13 which operates for a certain smallest magnitude at the input and thereby changes its output level. The detecting circuit is by means of its output connected to a monostable circuit 14 which at its output delivers a pulse of constant length at a level change at the input. This pulse length corresponds to the duration of an output pulse from the differentiating circuit under the worst conditions. The output of the monostable circuit is connected to the control input of an electronic or electromechanical contact device or switch 11 connected between the limiter 10 and the integrating circuit 12. In FIG. 2 the contact device is shown as a C-MOS field effect transistor. The monostable circuit is in order to guarantee stability in the system suitably designed in such a way that a certain smallest amount of time has to pass before retriggering can occur. The contact device 11 together with its control circuits 13 and 14 thus cause an isolation of the integrating circuit thereby providing a constant control voltage to the oscillator 5 at a certain smallest interference determined by the limiting and detecting levels of the circuits 10 and 13.

Figure 3:
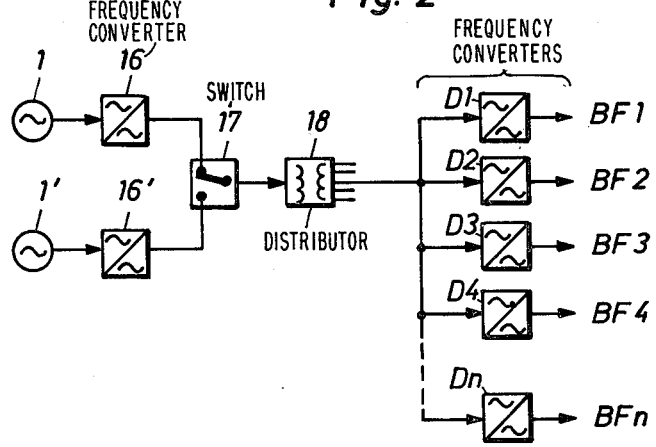
FIG. 3 shows a carrier frequency generating system according to known techniques.

In FIG. 3 a carrier frequency generating system is shown according to the prior art. To improve the reliability of the system two highly stable main oscillators 1 and 1' are feeding a switch 17 via a frequency converter 16 and 16' respectively. Both the main oscillators provide output voltage during normal operation and when there is an error at the oscillator which for the moment is connected to the system a switching is made to the other oscillator. To the switch a so called distributor 18 is connected at all the outputs of which a signal of the generated basic frequency is provided for further distribution in the system. One of the outputs of the distributor is shown connected to n frequency converters D1 to Dn which each converts the basic frequency to a desired carrier frequency (BF1 ... BFn). The frequency converters in the system can for example be of the phase-locked loop type. The switch 17 which is controlled by the signal level at the outputs from the converters 16 and 16' respectively can for example be realized by a relay.

At the switching between the oscillators a short interruption occurs whose magnitude is in the order of milliseconds and as the oscillators in general are not phase-locked to each other a phase jump also occurs which among other things causes transient problems in the system as mentioned above.

Load changes caused by, for example, maintenance work at the distribution points for the basic frequency may be detected by the frequency converter (D1 ... Dn) as phase jumps when the converters are realized as phase-locked loops. This may with loops of conventional kind cause the above mentioned errors. If, however, the frequency converters (D1 ... Dn) are replaced by apparatuses according to FIG. 2 a system compatible with the system according to FIG. 3 is achieved. Such a system is much more insensible to interferences.

Figure 4:
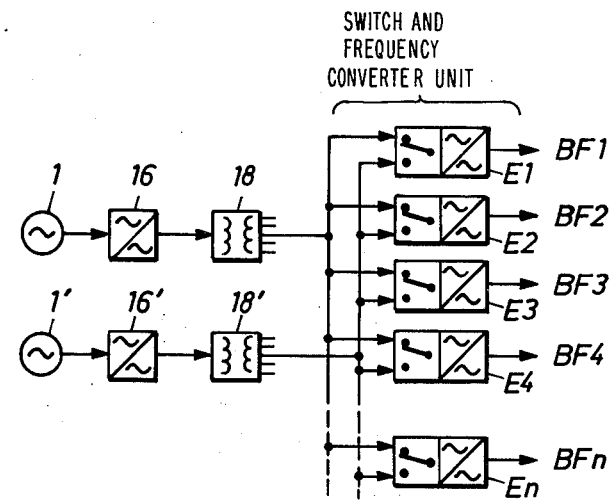
FIG. 4 shows a carrier frequency generating system comprising apparatus according to the invention.

In FIG. 4 a carrier frequency generating system with apparatuses according to the invention is shown. Compared with the system according to FIG. 3 this system is in duplicate up to and including the distributors 18 and 18' respectively and the switching function is decentralized to one switch per generated carrier signal. By this reorganization, central points in the signal distribution have been avoided which means increased reliability. Owing to the fact that the units (E1 ... En) each consisting of a switch and a frequency converter, utilize a phase locked loop according to the invention an automatic switching between the main oscillators free from interruptions and phase shift is obtained.

Figure 5:
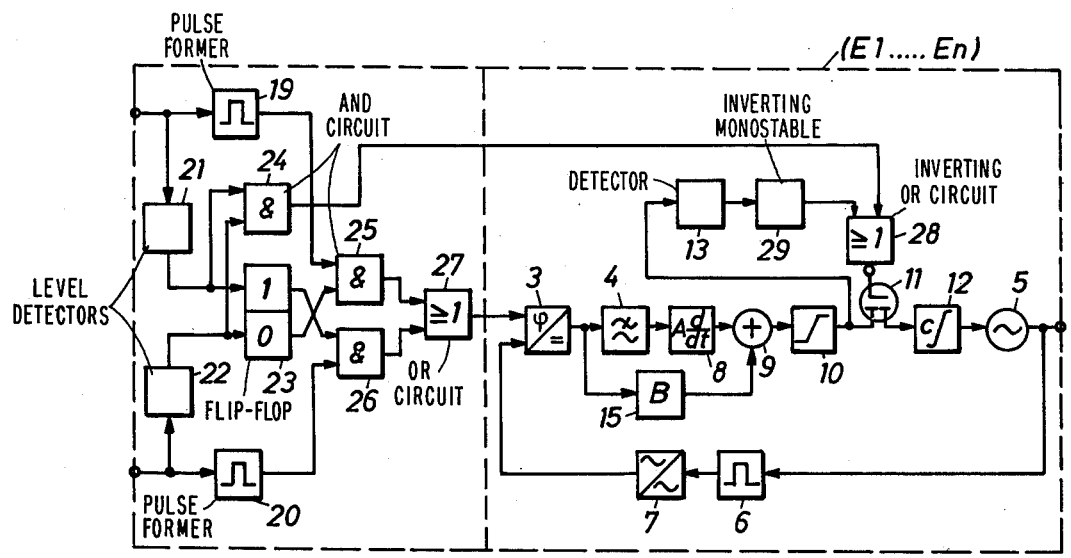
FIG. 5 shows an apparatus according to the invention adapted for use in the system according to FIG. 4.

In FIG. 5 an apparatus according to the invention is shown adapted for use in the system according to FIG. 4. A somewhat modified phase locked loop according to FIG. 2 has been combined with an automatic electronic switch and constitutes together one unit (E1 ... En) according to FIG. 4. To each input of the switch a level detector 21 and 22 respectively has been connected which gives a high output level when the input signal is below a certain level. The inputs are, furthermore, each connected to a pulse former 19 and 20 respectively which converts the sinusodial input signal to a symmetrical square wave adapted to the logic levels of the following circuits.

The outputs from the level detectors control an asynchronous sequence circuit 23. This circuit works as a common SR-flip-flop irrespective of the fact that a high level at both the inputs keeps the previously output level of the circuit. The output of each pulse former is connected to the one input of an AND-gate 25, 26, the other inputs of which are connected to the two complementary outputs from the sequence circuit. The outputs of the two AND-gates are connected to the two inputs of a following OR-gate.

If it is assumed for example that the oscillator 1 is erroneous causing the level detector 21 to give a high output signal, the sequence circuit will give a high level on the output connected to the AND-gate 26, and the signal from the oscillator 1' via the pulse former 20 and the AND-gate 26 is allowed to pass to the output of the OR-gate 27 connected to the phase discriminator 3.

The inputs of the sequence circuit 23 are connected in parallel to the inputs of an AND-gate 24 which thus gives a high output signal level at simultaneous errors in the voltages from both the oscillators 1 and 1'. The other part of the apparatus according to FIG. 5 consists as previously mentioned, of a modified phase locked loop according to the invention. The modification consists of using an inverted output from a monostable circuit. Thus monostable circuit 14 is replaced by a similar circuit except that its output is inverted. This is shown as element 29. An inverted OR gate 28 is connected to the control input of the switch 11 and receives the signals from the monostable circuit 29 and the AND-gate 24. Thus the isolation of the integrating circuit 12 can also be initiated directly from the switching part of the unit (E1 ... En).

Upon simultaneous errors in the voltages or a complete drop out of both the oscillators 1 and 1' the integrating circuit 12 is thus isolated, the output signal from the oscillator 5 keeping correct frequency for a long time after the error has occurred.

This function makes possible the simultaneous disconnection of both the oscillators 1 and 1' for service work or error location.

We claim:

1. In an interference resistant phase-locked loop, particularly for carrier frequency generation in Frequency Division Multiplex telecommunication systems of the type having a voltage controlled oscillator provided with a control input and a signal output, a phase discriminator with two inputs and one output to which inputs are fed a reference signal and a feedback signal respectively, the feedback signal being derived from the output signal of the oscillator, and a low pass filter for filtering of the phase difference representing output signal from said discriminator, the improvement comprising a transmission path arranged to connect the output of the low pass filter with the control input of the oscillator, said transmission path comprising a series connection of a differentiating circuit for the differentiation of the output signal from the low pass filter, a limiter which limits the output signal from the differentiating circuit at two levels symmetrically arranged on both sides of a zero level, and an integrating circuit having an output which produces a control voltage for said oscillator.

2. A phase-locked loop according to claim 1, and further comprising a summing circuit between said differentiating circuit and said limiter, said summing circuit being provided with a first and a second input and one output, said first input being connected to the output of said differentiating circuit, an amplifier, said second input being connected to the output of the phase discriminator via said amplifier, said amplifier providing constant amplification for balancing in the phase locked condition the influence of the OFF-SET voltage of the differentiating and the integrating circuits.

3. A phase-locked loop according to claim 1, and further comprising a summing circuit between said differentiating circuit and said limiter, said summing circuit being provided with a first and a second input and one output, said first input being connected to the output of said differentiating circuit, an amplifier, said second input being connected to the output of the low pass filter via said amplifier, said amplifier providing constant amplification for balancing in the phase locked condition the influence of the OFF-SET voltages of the differentiating and the integrating circuits.

4. A phase-locked loop according to claim 1, further comprising an electrically controlled break contact means between said limiter and said integrating circuit, said break contact means being provided with a first and a second main terminal and a control input said first main terminal being connected to the output of the limiter and said second main terminal being connected to the input of the integrating circuit and threshold pulse generating means connected from the output of said limiter to the control input of said break contact means for generating a control pulse of a given width whenever there is a given change in the magnitude of the signal at the output of said limiter.

5. A phase-locked loop according to claim 4 wherein said threshold pulse generating means comprises a detecting circuit connected in series with a monostable circuit.

* * * * *